(12) United States Patent
Divincenzo et al.

(10) Patent No.: US 9,712,129 B2
(45) Date of Patent: Jul. 18, 2017

(54) CAPACITIVELY COUPLED GYRATOR BASED ON THE HALL EFFECT

(71) Applicant: FORSCHUNGSZENTRUM JUELICH GMBH, Juelich (DE)

(72) Inventors: David Divincenzo, Voerendaal (NL); Giovanni Viola, Aachen (DE)

(73) Assignee: Forschungszentrum Juelich GmbH, Juelich (DE)

( * ) Notice: Subject to any disclaimer, the term of this patent is extended or adjusted under 35 U.S.C. 154(b) by 0 days.

(21) Appl. No.: 15/037,201

(22) PCT Filed: Oct. 31, 2014

(86) PCT No.: PCT/DE2014/000558
§ 371 (c)(1),
(2) Date: May 17, 2016

(87) PCT Pub. No.: WO2015/078426
PCT Pub. Date: Jun. 4, 2015

(65) Prior Publication Data
US 2016/0294345 A1    Oct. 6, 2016

(30) Foreign Application Priority Data
Nov. 29, 2013 (DE) .......................... 10 2013 018 011

(51) Int. Cl.
*H03H 7/00* (2006.01)
(52) U.S. Cl.
CPC .................................. *H03H 7/002* (2013.01)
(58) Field of Classification Search
CPC ................................ H03H 7/002; H01L 43/06
See application file for complete search history.

(56) References Cited

U.S. PATENT DOCUMENTS 2,649,574 A    8/1953    Mason
2,944,220 A    7/1960    Tellegen
(Continued)

FOREIGN PATENT DOCUMENTS

DE         11 44 355         2/1963
DE     10 2013 006 377     5/2014

OTHER PUBLICATIONS

Kim Brian S et al: "Generalized four-point characterization method using capacitive and ohmic contacts", Review of Scientific Instruments, AIP, Melville, NY, US, vol. 83, No. 2, Feb. 1, 2012 (Feb. 1, 2012), pp. 24703-24703, XP012161872, ISSN: 0034-6748, DOI: 10.1063/1.3677331 [retrieved on Feb. 2, 2012] abstract, paragraphs [000V], [00V1].

(Continued)

*Primary Examiner* — Dean Takaoka
*Assistant Examiner* — Alan Wong
(74) *Attorney, Agent, or Firm* — Jordan and Koda, PLLC (57) ABSTRACT

A gyrator for AC signals was developed. This gyrator comprises a Hall effect material, means for permeating this Hall effect material with a magnetic field that is perpendicular to the plane or surface of the material, at least one input port for coupling an alternating current ($I_1$; $I_2$) into the Hall effect material, and at least one output port for outcoupling an output voltage ($U_2$; $U_1$) which is a measure of the Hall voltage generated by the incoupled alternating current. Each of these ports has at least two terminals, which are connected to the outside. At least one terminal of each port is connected to a connecting electrode, which is electrically insulated from the Hall effect material and forms a capacitor together with the Hall effect material. The alternating current is thus capacitively coupled into the Hall effect material, and the output voltage is capacitively coupled out of the Hall effect material. The capacitive coupling of the connecting elec- (Continued)

trodes provides boundary conditions for the potential in the interior of the Hall effect material, which do not necessarily force potential jumps there. The development of "hot spots," at which energy is dissipated, in the region of potential jumps can thereby advantageously be reduced or even entirely suppressed.

20 Claims, 4 Drawing Sheets

(56) References Cited

U.S. PATENT DOCUMENTS

| | | | |
|---|---|---|---|
| 3,047,821 A | 7/1962 | Hilbinger | |
| 3,134,082 A | 5/1964 | Arlt | |
| 3,214,682 A * | 10/1965 | Wick | H01L 43/06 |
| | | | 257/E43.002 |
| 6,100,773 A * | 8/2000 | Nakamichi | H03H 7/38 |
| | | | 333/32 |
| 9,276,197 B2 * | 3/2016 | Johnson | G11C 11/18 |
| 2009/0137066 A1 * | 5/2009 | Imai | H01L 43/14 |
| | | | 438/3 |

OTHER PUBLICATIONS

S. Grutzmann: "Hall-effect gyrators, isolators, and circulators with high efficiency", Proceedings of the IEEE, vol. 51, No. 11, Nov. 1, 1963 (Nov. 11, 1963), pp. 1584-1588, XP055173930, ISSN: 0018-9219, DOI: 10.1109/PROC.1963.2630 paragraphs [0011]-[001V]; figures 2, 6-7.

* cited by examiner

FIG. 4

CAPACITIVELY COUPLED GYRATOR BASED ON THE HALL EFFECT

The invention relates to a gyrator for AC signals.

BACKGROUND OF THE INVENTION

A gyrator is an electric two-port network element in which the voltage at the output is proportional to the current at the input, the sign of the voltage changing when the input and output are reversed. If the current is an alternating current, it is thus converted into either an in-phase alternating voltage or an alternating voltage in phase opposition, depending on the port of the gyrator to which this current is applied. The gyrator is necessary as a fifth linear element, in addition to the resistor, capacitor, inductor and ideal transformer, for realizing two-port network elements that allow an alternating voltage to pass only in one direction (isolators), or three-port or multi-port elements that allow an alternating voltage to pass a port only to a next port in a fixed rotational direction (circulators).

So as to render the conversion of the input current into the output voltage dependent on the direction of current through the gyrator, Faraday rotation in ferrites under the influence of an external magnetic field is used in the microwave range. For this purpose, it is necessary for an electromagnetic wave generated by the input current to propagate in the ferrite. The dimensions of the ferrite must therefore be in the order of magnitude of the wavelength, bringing the ferrite to an impracticable size for frequencies in the radio or audio frequency range. This also ceases to operate efficiently at frequencies below the microwave range. Additionally, as a result of the physical dimensions, every gyrator is limited to a substantially narrow frequency band.

As an alternative, a gyrator may also be realized as an active circuit composed of transistors and fed-back operational amplifiers. Such a circuit, however, requires a power supply unit and produces both noise and heat.

A passive gyrator for lower frequencies is known from U.S. Pat. No. 2,649,574, in which the Faraday rotation in the ferrite is replaced with a planar Hall effect. The disadvantage is that high contact resistances impede both coupling of the current into the Hall effect material and tapping of the Hall voltage, which impairs the efficiency of the gyrator.

The German patent application 10 2013 006 377.9 therefore pursues the approach of inductively coupling the Hall effect material to the outside so as to utilize the Hall effect, while avoiding losses due to contact resistances. Due to the complex, non-planar geometry, however, production is complex, and the inductive coupling requires highly permeable magnetic materials for low operating frequencies.

It is therefore the object of the invention to provide a gyrator which, at low frequencies on the order of magnitude of 1 to 100 MHz, operates more efficiently than gyrators according to the prior art.

This object is achieved according to the invention by a gyrator according to the main claim. Further advantageous embodiments will be apparent from the dependent claims.

As part of the invention, a gyrator for AC signals was developed. This gyrator comprises a Hall effect material, means for permeating this Hall effect material with a magnetic field that is perpendicular to the plane or surface of the material, at least one input port for coupling an alternating current ($I_1$; $I_2$) into the Hall effect material and at least one output port for outcoupling an output voltage ($U_2$; $U_1$) which is a measure of the Hall voltage generated by the incoupled alternating current. Each of these ports has at least two terminals, which are connected to the outside.

The Hall effect material may be, for example, a gallium arsenide heterostructure, an electrically conductive monolayer, such as graphene, or another material that is electrically conductive in two dimensions. The shape thereof in the two dimensions in which it is conductive may, in particular, be round or substantially round. In principle, however, the shape is not subject to any limitations. Ideally, it should be a topological body within the meaning that a defined current direction for the input current exists thereon in one spatial dimension, and a charge separation caused by the Hall effect can take place in another spatial dimension, which ideally is perpendicular thereto.

According to the invention, at least one terminal of each port is connected to a connecting electrode, which is electrically insulated from the Hall effect material and forms a capacitor together with the Hall effect material. The alternating current is thus capacitively coupled into the Hall effect material, and the output voltage is capacitively coupled out of the Hall effect material. The capacitor advantageously has a capacitance of at least 300 aF, and preferably a capacitance of at least 1 fF.

If only one terminal of a port is connected to a connecting electrode, the other terminal can be connected to a defined potential for establishing a reference point for the input current or for the output voltage, for example outside the Hall effect material. If only one respective terminal of two or more ports is connected to a connecting electrode, in particular all terminals that are not connected to a connecting electrode may be connected to the same defined potential outside the Hall effect material. These can then optionally also be connected to each other.

The insulation between the connecting electrodes and the Hall effect material may be, for example, a vacuum, an air gap, or an insulating layer that is applied to the Hall effect material or around the Hall effect material. The Hall effect material may also be entirely potted in an insulating material.

The connecting electrodes can be made of metal, doped semiconductors or other conductive material having no major Hall effect. The connections between the terminals and the connecting electrodes and between the terminals and the outside can be implemented by conventional wires.

It was found that, in the galvanic coupling of the Hall effect material to the input and output ports according to the prior art, the direct contact between connecting electrodes and the Hall effect material predefined boundary conditions that forced a local potential distribution within the Hall effect material that was disadvantageous for efficiency. An electrically conductive connecting electrode forced the local potential in the entire region in which the electrode was directly seated against the Hall effect material to assume a shared value. This forcing ended abruptly at the edge of the connecting electrode. In these edge regions, the potential made discontinuous jumps in the Hall effect material. Even if the Hall effect material itself was perfect and had a Hall angle of approximately 90 degrees, local energy was dissipated in the region of these jumps.

Since, according to the invention, the connecting electrode and the Hall effect material act as plates of a capacitor, a charge present on one of these plates induces a corresponding polarization charge on the other plate. This takes place according to the general rules of electrostatics, based on which the influence of a charge present on one plate on the other plate depends on the distance from this charge according to continuous functions. The boundary conditions that the connecting electrode predefines for the potential distribution in the Hall effect material are therefore not discontinuous to begin with. The development of "hot spots," at which energy is dissipated, in the region of potential jumps can thus advantageously be reduced or even entirely suppressed.

This applies in particular in one particularly advantageous embodiment of the invention, in which the capacitor pre-defines boundary conditions for the spatial distribution of the potential in the Hall effect material, which allow a continuous potential progression in the region of the Hall effect material which is located directly opposite the edge of the connecting electrode.

Even if only one of the two terminals of the input port is connected to a connecting electrode (input electrode) that forms a capacitor together with the Hall effect material, even an alternating current fed at the input port can be coupled into the Hall effect material at which a non-defined ("floating") potential is present. This alternating current periodically charges and discharges the capacitor formed of the input electrode and the Hall effect material. As a result of the current, an electromotive force is generated in the Hall effect material, which results in a charge separation and consequently in the formation of a Hall voltage perpendicular to the direction of the current and to the magnetic field. This displacement of the charge also affects the region located opposite the connecting electrode (output electrode) that belongs to the output port. A corresponding polarization charge is influenced on this output electrode, whereby the potential of the same is changed. This can be measured at the output port as an output voltage, which is in-phase with respect to the input current. For this purpose even one output electrode suffices, if the other terminal of the output port is connected to a suitable reference point outside the Hall effect material. If the input port and output port are reversed, the sign of the output voltage changes, so that the same is in phase opposition with respect to the input current.

Advantageously, each of the two terminals of the input port is connected to a connecting electrode (input electrode), wherein the two input electrodes are electrically insulated from the Hall effect material and form a respective capacitor together with the Hall effect material. The alternating current between the two input electrodes can then be driven through the Hall effect material. The current is thus given a defined direction through the Hall effect material, which in turn establishes the direction in which the charge separation takes place.

Advantageously, both terminals of the output port are each connected to a respective connecting electrode (output electrode), wherein the two output electrodes are electrically insulated from the Hall effect material and form a respective capacitor together with the Hall effect material. The output voltage between the two terminals of the output port then corresponds to the voltage in the Hall effect material, which drops between the two output electrodes. This output voltage is free of an external reference point and is therefore more meaningful.

The two measures can in particular be combined with each other in a particularly advantageous embodiment of the invention. A total of four connecting electrodes then each form a capacitor together with the Hall effect material.

Two of the connecting electrodes are then input electrodes, and two are output electrodes.

In principle, arbitrary numbers of ports are possible, and more particularly 3, 5 or 6. A gyrator having three ports can be produced from the above-mentioned exemplary embodiment comprising four connecting electrodes, for example, by connecting an input terminal and an output terminal to each other in a conducting manner and considering these as a terminal of the third port. This may optionally also be grounded. The operating principle of a gyrator having three ports is described in (J. Shekel, Proceedings of the IRE 41 (8), 1014 (1953)) considering this to be a loss-free "ideal" element. The gyrator according to the invention can have this ideal characteristic when the Hall angle θ of the Hall effect material is approximately 90°.

A gyrator having 3, 5 or 6 ports may also be used as a circulator, for example. The ports can then be disposed in a cyclical order such that an input current supplied at one port can be tapped at the next port in the series as an in-phase output voltage, but as an output voltage in phase opposition at the preceding port in the series.

In a particularly advantageous embodiment of the invention, in at least two spatial dimensions, the Hall effect material has an extension such as to conain, along each of these spatial dimensions, at least one million electrons that are mobile in both spatial directions. Once this critical limit has been reached, the Hall effect, and thus the action of the gyrator, are produced at almost full strength. If the dimensions of the material are enlarged further, only a comparatively minor increase can be achieved. Small structures are technologically more difficult to produce from the Hall effect material than solid bodies, such as disk. In return, less of the precious Hall effect material is needed to produce the same.

For example, the Hall effect material can advantageously have an extension of at least 100 nm, preferably at least 500 nm, and most particularly preferably of at least 1 μm in at least two spatial dimensions. Structures having a size of at least 1 μm in particular offer an especially good compromise between material savings and complexity of production since they can be produced using diffraction-limited lithography, which is technologically less demanding.

In a particularly advantageous embodiment of the invention, the local capacitance per unit of length measured along an outer circumference of the Hall effect material, which leads from a connecting electrode (input electrode) connected to the input port to a connecting electrode (output electrode) connected to the output port, is lower in the edge regions of the connecting electrodes than in the remaining regions of the connecting electrodes. Between the conductivity σ of the Hall effect material, the unit vector $\vec{n}_\theta$, which is tilted with respect to the normal onto the surface of the Hall effect material by the Hall angle θ, the operating frequency ω, the capacitance per unit of length c(s), the potential V(s) in the Hall effect material, and the external potential $V_{ext}(s)$ caused by the connecting electrode, the following boundary condition, which is dependent on the location s on the outer circumference, is present in the vicinity of the connecting electrode:

$$-\sigma \cdot (\vec{n}_\theta \cdot \vec{\nabla} V(s)) = i\omega c(s)(V_{ext}(s) - V(s)).$$

The range of frequencies ω for which this boundary condition can be met thus depends on the progression of c(s). The c(s) best suited for a range of desired operating frequencies ω of the gyrator can be ascertained by way of parameter optimization or calculus of variation, for example.

If c(s) is sufficiently good, even if it includes isolated finite jumps (such as when the capacitance is constant in sections), the borderline case θ=90° is of particular interest. $\vec{n}_\theta$ then runs tangentially to the outer circumference of the Hall effect material, whereby the boundary condition is simplified to $$-\sigma \partial V(s) = i\omega c(s)(V_{ext}(s) - V(s))$$

Strictly speaking, this equation states not only a boundary condition, but is also a closed-form ordinary differential equation of a scalar variable s, which describes the one-dimensional coordinate along the circumference of the Hall effect material. The solution for the potential V(F) in the interior of the Hall effect material is essentially predefined by the solution V(s) at the edge.

In the homogeneous case, in which the external potential $V_{ext}$ disappears, the differential equation corresponds to the time-independent Dirac equation in a dimension having a location-dependent mass that is proportional to c(s). It is an eigenvalue equation with the periodic boundary condition that the solution is continuous along the circumference of the Hall effect material. Thus V(0)=V(P) must apply, in which P is the length of the circumference. The solutions are thus not dependent on the shape of the circumference, but only on the length thereof.

Now, all that must be known is a special solution of the inhomogeneous case having an external potential $V_{ext}$ other than zero. All further solutions of the inhomogeneous case result from this by adding any arbitrary solution of the homogeneous case to the special solution. In particular, the solutions of the homogeneous case thus determine the qualitative behavior of the inhomogeneous case. Natural frequencies of the homogeneous case result in poles in the inhomogeneous case at which the potential distribution becomes discontinuous and hot spots develop, at which energy is dissipated. They correspond to the frequencies at which the capacitively coupled Hall effect material shows magnetoplasmon resonances and are equidistantly distributed across the frequency spectrum.

Thus for a given Hall effect material geometry, there is no optimal range of operating frequencies ω for the gyrator, but on the contrary, a "picket fence" of equidistantly distributed natural frequencies exists in the frequency spectrum, at which the Hall effect material has a magnetoplasmon resonance, and the gyrator therefore does not operate optimally.

Away from these natural frequencies, which is to say at a distance from the natural frequencies that is at least 20% of the distance between two natural frequencies, the solutions of the differential equation are very good in the sense that no discontinuities, and consequently no energy-dissipating hot spots, occur in the Hall effect material. In the borderline case that the Hall effect material is a quantum Hall effect material having a Hall angle θ of 90°, the calculation of the overall dissipated Joule heating yields zero as a scalar product $\vec{j}(\vec{r}) \cdot \nabla V(\vec{r})$ at every location $\vec{r}$ in the Hall effect material since both vectors are always perpendicular to each other. In general, the angle between the two vectors corresponds to the Hall angle θ.

The condition for this is that c(s) is limited, which is to say that there is a value which c(s) does not exceed along an outer circumference of the Hall effect material leading from the input electrode to the output electrode. A Neumann boundary condition for solving the differential equation results in structurally similar solutions, however c(s) must tend to infinity along the edge of the Hall effect material. The solution then becomes singular at the edge, which corresponds to a strong potential gradient $\nabla V(\vec{r})$ and results in lossy hot spots.

Advantageously, the local capacitance per unit of length of the capacitor formed by each connecting electrode together with the Hall effect material is thus limited along an outer circumference of the Hall effect material, which leads from a connecting electrode connected to the input port to a connecting electrode connected to the output port.

The capacitance per length c(s) can be varied, for example, by varying the overlap of the connecting electrode with the Hall effect material and/or the thickness and/or the relative permittivity of the insulation between the connecting electrode and the Hall effect material. However, in a further particularly advantageous embodiment of the invention it can also be varied in relation to the run time of the gyrator. In this embodiment, means for applying an electric bias field to the insulating region between at least one connecting electrode and the Hall effect material are provided, the bias field changing the spatial distribution of the capacitance across the region of the connecting electrode. The capacitor then advantageously includes a ferroelectric or a non-linear dielectric as insulation between the connecting electrode and the Hall effect material.

In a further particularly advantageous embodiment of the invention, the connecting electrodes are disposed along an outer circumference of the Hall effect material in relation to each other such that, paths must be traveled, in opposite directions along this circumference from a connecting electrode to the neighboring connection electrode, that have lengths that differ by no more than 10%. The connecting electrodes are then evenly distributed along the outer circumference of the Hall effect material. If the Hall effect material is present as a circular ring or circular disk, for example, the connecting electrodes are offset, in each case, at 90° from each other along the circular circumference in a gyrator having two input electrodes that belong to an input port and two output electrodes that belong to an output port, which is to say a total of four connecting electrodes. In a gyrator having three connecting electrodes, these are offset, in each case, at 120° from each other. The better this symmetry condition is met, the higher is the efficiency of the gyrator. The condition not only applies to circular rings, circular disks and other simple structures, but generally speaking also to completely irregular and non-symmetrical shapes for the Hall effect material. In a further advantageous embodiment of the invention, these structures can have holes for the purpose of saving weight and material. The overall surface area of the holes may amount up to nine times the surface area taken up by Hall effect material.

In a further particularly advantageous embodiment of the invention, the outer circumference of the Hall effect material has a self-similar, in particular fractal, structure, at least in a sub-region in which one of the connecting electrodes forms a capacitor with this sub-region. The larger the length L, the lower the operating frequencies ω that are possible. Previously, no effective gyrators have been available, especially for lower frequencies in the radio and audio range; the invention is notably intended to close this gap. A self-similar, in particular fractal, structure is one of the structures that has the largest length L, yet minimal material consumption, which topological can still be considered a body, so that a defined direction of the current and a direction for the charge separation by the Hall effect exist therein.

Likewise, it is also advantageous for the achievement of low operating frequencies to design the capacitance of the capacitor formed by the connecting electrode and the Hall effect material as large as possible. For this purpose, for example, the connecting electrode may partially overlap a planar region of the Hall effect material, and more particularly either on one side or on both sides, spaced apart by a respective suitable insulation.

Instead of a fractal structure, it is also possible to use another highly convoluted structure, such as an interdigitating structure, such as is used for metal electrodes in thin-film capacitors.

For the special case of a gyrator having two input electrodes and two output electrodes, the matrix $Y_2$ of the complex conductance value is defined by $$Y_2(\omega) = \sigma \begin{pmatrix} iy_o(\omega) & y_e(\omega) \\ -y_e(\omega) & iy_o(\omega) \end{pmatrix},$$

where $y_e(\omega)$ is even functions and $y_o(\omega)$ is odd functions of the frequency $\omega$, $\sigma$ is the conductivity of the Hall material. A necessary condition for this symmetrical shape for the matrix $Y_2(\omega)$ is that the capacitors formed by all connecting electrodes with the respective Hall effect material have identical capacitances. In a particularly advantageous embodiment of the invention, the capacitances of capacitors formed by all connecting electrodes with the respective Hall effect material differ from each other by no more than 10%.

If, in the regions in which the connecting electrodes form a respective capacitor with the Hall effect material, the capacitance of the capacitor is constant at least in sections, the above-discussed one-dimensional differential equation in each of these sections results in the functions $$y_o(\omega) = -\tan\left(\frac{c\omega W}{\sigma}\right)/2$$
$$y_e(\omega) = \left(\sec\left(\frac{c\omega W}{\sigma}\right) - 1\right)/2,$$

where W is the length of the section on which the capacitance per unit of length $c(s)$ is constant, and c is the constant value of $c(s)$ in this section.

$Y_2(\omega)$ becomes the matrix of an ideal gyrator when $y_o(\omega)=0$. These zeros occur periodically in the frequency and are located exactly in the middle between two magnetoplasmon resonance frequencies. They are the optimal operating frequencies of the gyrator. In these, $c\omega W/\sigma$ is an odd-numbered multiple of $\pi$.

The value of $\sigma$ sets the impedance of the gyrator and in particular is adapted to the devices or elements of the outside, which are connected to the ports. In generally, one strives to increase $\sigma$ so as to bring the impedance in the vicinity of the standard impedance for high-frequency applications of 50Ω.

For a gyrator having three ports, and in particular a gyrator having three connecting electrodes, the matrix $Y_3(\omega)$ of the complex conductance value is $$Y_3(\omega) = \sigma \begin{pmatrix} iy_d(\omega) & y_l(\omega) & -y_l^*(\omega) \\ -y_l^*(\omega) & iy_d(\omega) & y_l(\omega) \\ y_l(\omega) & -y_l^*(\omega) & iy_d(\omega) \end{pmatrix},$$

where $$y_d(\omega) = \frac{-2\sin\left(\frac{c\omega W}{\sigma}\right)}{1 + 2\cos\left(\frac{c\omega W}{\sigma}\right)},$$

$$y_l(\omega) = \frac{1 - \exp\left(\frac{c\omega W}{\sigma}\right)}{1 + 2\cos\left(\frac{c\omega W}{\sigma}\right)}$$

and the asterisk (*) denotes the complex conjugated value. An ideal gyratory effect between the three ports is produce at the frequencies $\omega$ at which $y_d(\omega)=0$ and at the same time $y_i(\omega)$ are real-valued.

The condition for the symmetrical shape for the matrix $Y_3(\omega)$ is that the three ports are each connected to connecting electrodes that, in sum, form the same capacitances with the Hall effect material. This can be achieved, for example, in that a respective terminal of one of the three ports is connected to a connecting electrode, and all three connecting electrodes form identical capacitances with the Hall effect material. Identical capacitances for all three ports, however, can also be achieved with four connecting electrodes, in which the capacitance respectively produced with the Hall effect material by two is half that of the other two. The two connecting electrodes having half the capacitances are then connected to each other and assigned to the same port.

The decisive factor for the behavior of the gyrator is, in each case, only the respective share of the outer circumference of the Hall effect material that forms a capacitor together with the connecting electrodes. In a particularly advantageous embodiment of the invention, the Hall effect material thus forms a capacitor together with at least one connecting electrode along at least one outer circumference over at least 2%, and preferably between 50% and 70% of the length of this outer circumference.

In a further advantageous embodiment of the invention, at least one connecting electrode forms a capacitor together with multiple layers of the Hall effect material that are electrically insulated from each other. If the Hall effect material is present as a stack of multiple such layers, for example in the form of disks, the gyratory effect, which is to say the magnitude of the constant of proportionality between the output voltage and the input current, is advantageously increased, and boundary effects of the capacitor are reduced.

In a particularly advantageous embodiment of the invention, the Hall effect material is a quantum Hall effect material. The Hall angle $\theta$ by which the charge separation is tilted from the direction of the current through the material is then approximately 90°. This also applies to some Hall effect materials having no quantum Hall effect, such as arsenic, antimony, bismuth, $\alpha$-tin (gray tin), graphite, and thin layers of doped semiconductors. For many other materials, there are temperature ranges in which these likewise exhibit this property.

At a Hall angle of 90°, a continuous potential progression in the interior of the Hall effect material means that energy is no longer dissipated at hot spots. A loss-free gyrator, which at the same time is passive and therefore does not produce added noise, can be used particularly advantageously in low-temperature experiments in which dissipation would result in undesirable heating. Freedom from noise is advantageous in particular in experiments using qubits. In principle, however, all applications in the radio and audio frequency range below 100 MHz benefit from the availability of the gyrator according to the invention.

Ideally, the Hall effect material has a Hall angle $\Theta$ that is as close as possible to 90° and requires a magnetic field that is as low as possible for this purpose. The Hall properties should not be adversely affected by the further processing steps for producing the finished element. It is advantageous if the Hall effect material can be easily structured and mechanically processed, and if multiple layers made of this material can be easily connected in parallel so as to increase the capacitance of the capacitor.

The derivation of the boundary condition along the outer circumference of the Hall effect material which was used to study the behavior of the gyrator assumes that the current density vector $\vec{j}(\vec{r})$ in the interior of the Hall effect material is at least locally linear proportional to the electric field $\vec{E}(\vec{r})$:

$$\vec{j}(\vec{r}) = -\sigma R_\theta \vec{E}(\vec{r})$$

$$\hat{u} \cdot \vec{j}(\vec{r}) = -\sigma \partial_{(R_\theta^{-1}\hat{u})} V(\vec{r})$$

Herein, $\vec{r}$ is the two-dimensional position vector in the plane of the Hall effect material, $\sigma$ is the conductivity, which in two dimensions has the unit, ampere per volt. $R_\theta$ is an operator that rotates a vector by the angle $\theta$ about an axis parallel to the magnetic field which permeates the Hall effect material and that is perpendicular to the plane in which the two-dimensional electron gas can be moved. $\hat{u}$ is an arbitrary unit vector in this plane. $\vec{E}(\vec{r})$ is the gradient of the potential field $V(\vec{r})$. At low frequencies of interest, the laws of electrostatics are sufficient to describe the fields in the interior of the Hall effect material V thus satisfies Laplace's equation $$\nabla^2 V(\vec{r}) = 0.$$

Along the outer circumference of the Hall effect material, the capacitive connecting electrodes provided according to the invention introduce a local capacitance $c(\vec{s})$ per unit of length as a function of the position $\vec{s}$ on this outer circumference. In the region of the connecting electrodes, $c(\vec{s})$ is finite; $c(\vec{s})$ drops to zero in the gaps between the connecting electrodes. In general, the following relationship exists between the capacitance C of a capacitor and the charge Q stored therein:

$$Q = C\Delta V = C(V_{ext} - V).$$

A time derivative results in the current density term:

$$\hat{n} \cdot \vec{j}(\vec{s}) = \dot{Q}(\vec{s}) = c(\vec{s})(\dot{V}_{ext} - \dot{V}(\vec{s})).$$

Using the term stated at the outset for the current density, and assuming that both $V_{ext}$ and V having the angular frequency $\omega$ have a sinusoidal dependence on time, the central boundary condition that describes the behavior of the gyrator according to the invention is obtained. The function of the gyrator thus already follows from the fundamental laws of electrostatics.

DESCRIPTION OF THE PREFFERED EMBODIMENTS

The subject matter of the invention will be described hereafter based on the figures, without thereby limiting the subject matter of the invention.

Figure 1:
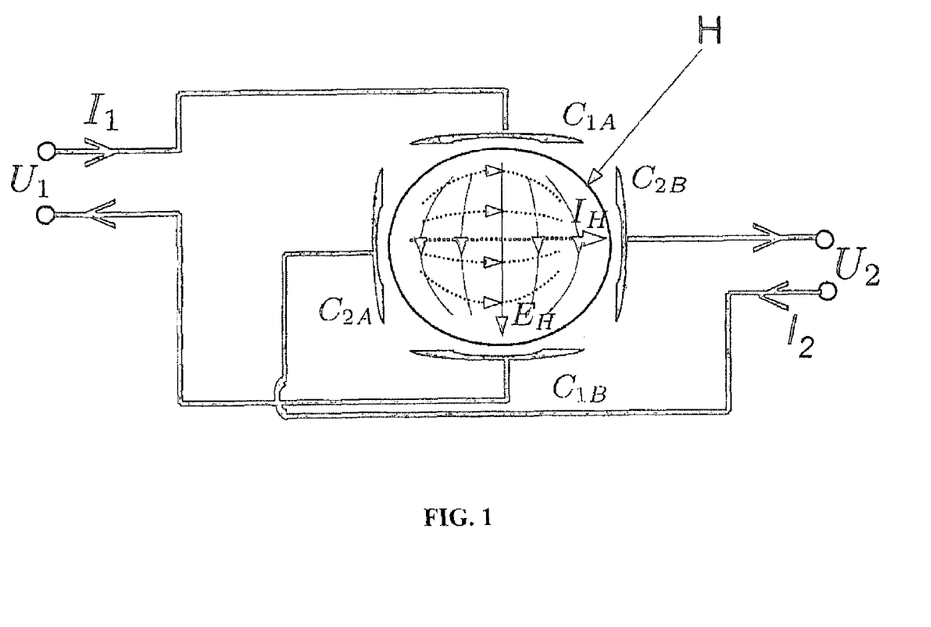
FIG. 1 shows a simple embodiment of the gyrator according to the invention.

FIG. 1 shows a simple embodiment of the gyrator according to the invention. The Hall effect material H is present as a circular disk here. Four metallic connecting electrodes are disposed along the circumference of this circular disk, which are each offset 90° from each other and form a respective capacitor together with the Hall effect material H. An alternating current $I_H$ is driven through the Hall effect material by way of two opposing input electrodes $C_{1A}$ and $C_{1B}$. As a result of the Hall effect, in conjunction with a magnetic field perpendicular to the drawing plane, an electric Hall field $E_H$ is generated, which is perpendicular to the direction of the current. This field results in a charge separation in the field direction. Corresponding polarization charges are influenced on opposing output electrodes $C_{2A}$ and $C_{2B}$, so that a potential difference forms between these two output electrodes. This difference can be tapped as output voltage $U_2$. The output voltage $U_2$ is in-phase with respect to the input current $I_1$.

When a current $I_2$ between the output electrodes $C_{2A}$ and $C_{2B}$ is driven through the Hall effect material H, an output voltage $U_1$ is created analogously between the input electrodes $C_{1A}$ and $C_{1B}$, however having a reverse sign. The output voltage $U_1$ is thus in phase opposition with respect to the input current $I_2$.

Figure 2:
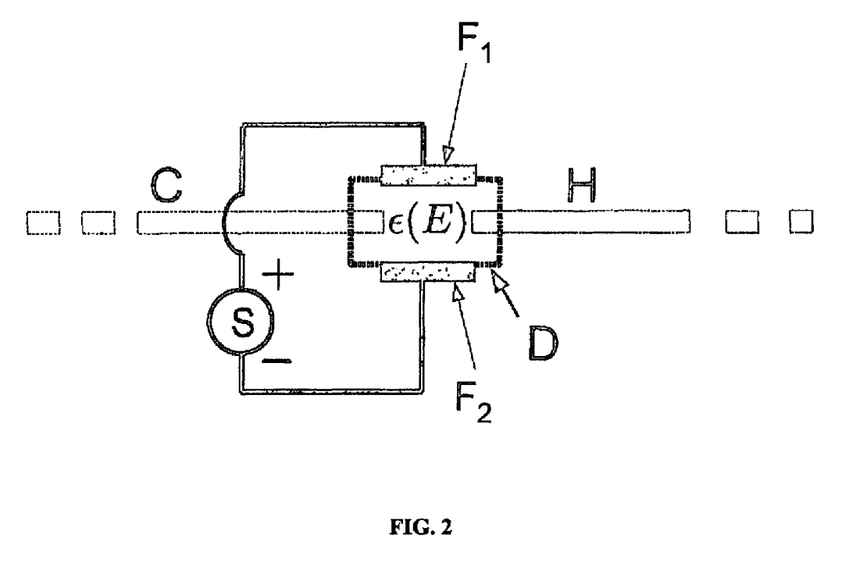
FIG. 2 illustrates the local influencing of the capacitance of the capacitor formed between the connecting electrode C and the Hall effect material H in relation to the run time of the gyrator in a side view.

FIG. 2 illustrates the local influencing of the capacitance of the capacitor formed between the connecting electrode C and the Hall effect material H in relation to the run time of the gyrator in a side view. The connecting electrode C is insulated with respect to the Hall effect material H by a dielectric D. This dielectric D is a ferroelectric or a non-linear dielectric, so that the relative permittivity $\in$ thereof depends on the electric field E in the interior thereof, $\in = \in(E)$. Two auxiliary electrodes $F_1$ and $F_2$, between which a variable electric field is created, are now supplied via a voltage source S. This field can be used to set $\in$ in the interior of the dielectric D to the desired value.

Figure 3:
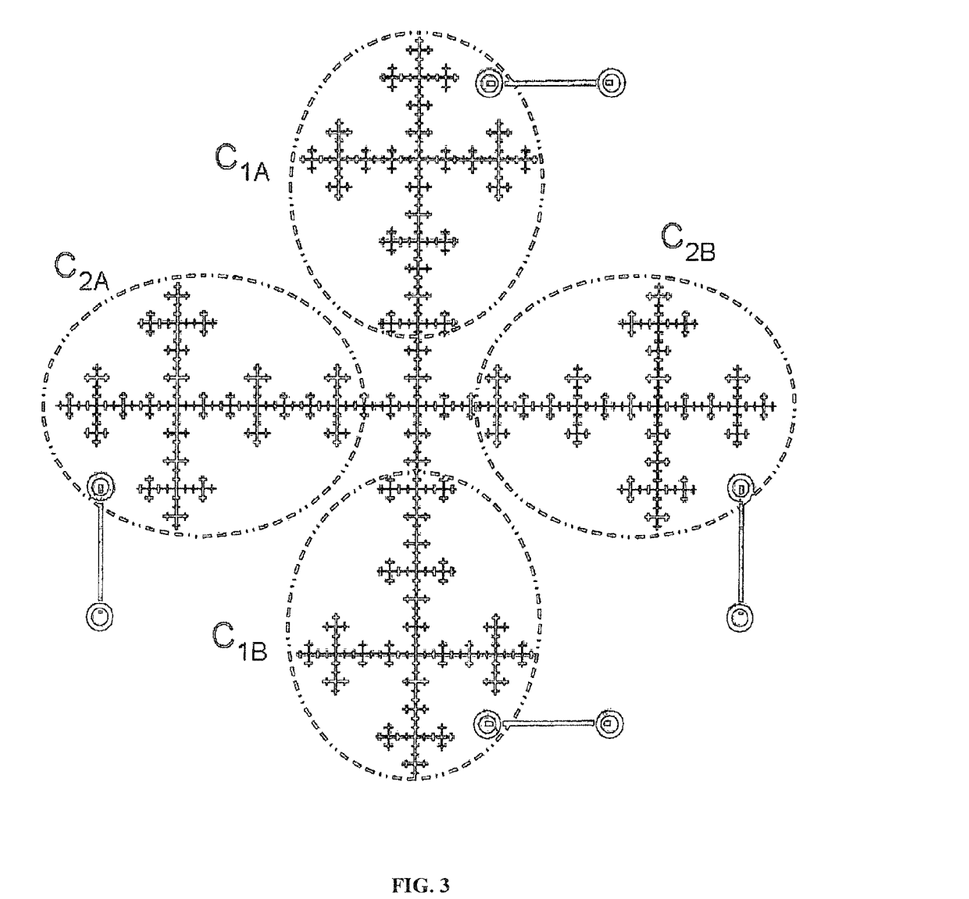
FIG. 3 shows an exemplary embodiment of a gyrator according to the invention in which the Hall effect material H has fractal structure.

FIG. 3 shows an exemplary embodiment of a gyrator according to the invention in which the Hall effect material H has a fractal structure. In the regions circled with dashes and dots, the Hall effect material H, which is completely surrounded by a dielectric (not shown in FIG. 3), forms a respective capacitor together with the four connecting electrodes $C_{1A}$, $C_{1B}$, $C_{2A}$ and $C_{2B}$, analogously to FIG. 1. The fractal shape lengthens the outer circumference of the Hall effect material H, without the same taking up more space in the overall. It is a shape that has minimal consumption of Hall effect material per unit of length of the outer circumference.

Figure 4:
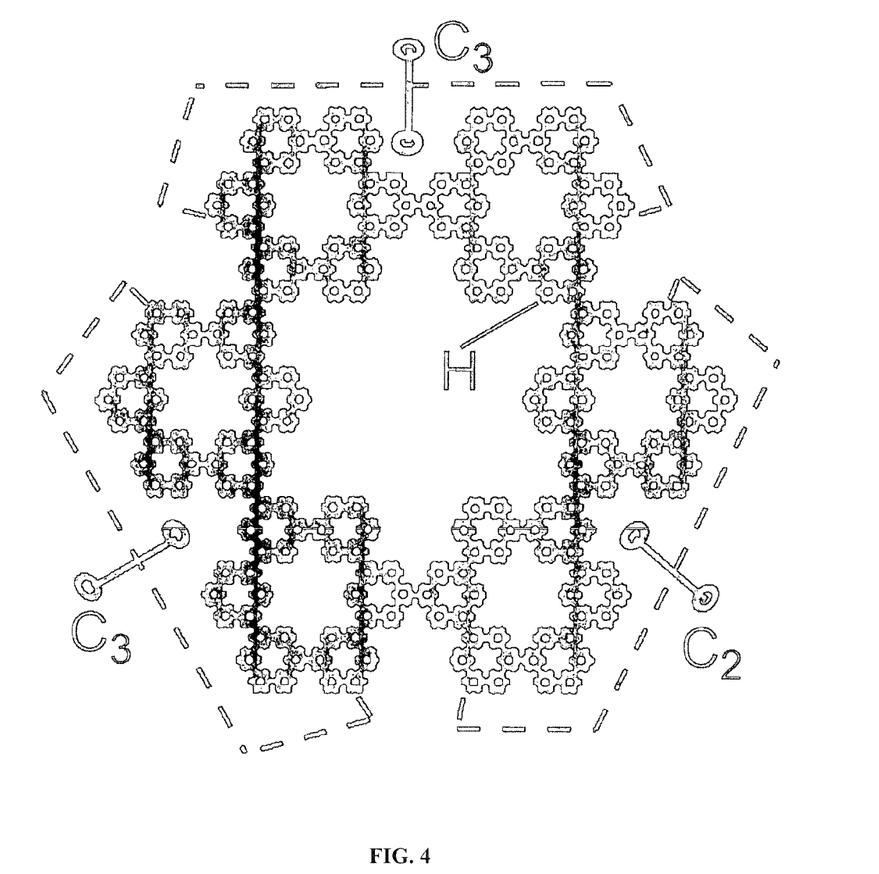
FIG. 4 shows a further exemplary embodiment of a gyrator according to the invention in which the Hall effect material H has a fractal structure.

FIG. 4 shows a further exemplary embodiment of a gyrator according to the invention in which the Hall effect material H has a fractal structure. The material is composed of a large number of small hexagons, wherein contact resistances between these hexagons are ignored. In the areas circled with the dotted line, the Hall effect material H forms a respective capacitor together with the three connecting electrodes $C_1$, $C_2$ and $C_3$. In the two opposite directions along the outer circumference of the Hall effect material H, the paths from one connecting electrode to the two other (neighboring) connecting electrodes are identical; for example, it is just as far from $C_2$ to $C_1$ as it is from $C_2$ to $C_3$. The holes in the structure of the Hall effect material H reduce the material consumption; the material, however, is still an integral topological bodys.

The invention claimed is:
1. A gyrator for AC signals, comprising:
a Hall effect material, means for permeating this Hall effect material with a magnetic field that is perpendicular to the plane or surface of the material, at least one input port for coupling an alternating current ($I_1$; $I_2$) into tie Hall effect material, and at least one output port for outcoupling an output voltage ($U_2$; $U_1$) which is a measure of the Hall voltage generated by the incoupled alternating current, wherein each port comprises at least two terminals that are connected to the outside, wherein at least one terminal of each port is connected to a connecting electrode, which is electrically insulated from the Hall effect material and forms a capacitor together with the Hall effect material, and wherein along an outer edge of the Hall effect material leading from said one terminal to said connecting terminal the Hall effect material has a local capacitance per unit length less than a prescribed value selected to meet a boundary condition for avoiding local magnetoplasmon resonance while allowing a continuous potential progression in a region of the Hall effect material located directly opposite an edge of the connecting electrode of said capacitor, and wherein the local capacitance per unit of length measured along said outer edge of the Hall effect material, which leads from the connecting electrode connected to the input port to the connecting electrode connected to the output port, is lower in the edge regions of the connecting electrodes than in the remaining regions of the connecting electrodes.

2. The gyrator according to claim 1, wherein each of the two terminals of the input port is connected to a connecting electrode, wherein these two connecting electrodes are electrically insulated from the Hall effect material and form a respective capacitor together with the Hall effect material.

3. The gyrator according to claim 1, wherein each of the two terminals of the output port is connected to a connecting electrode, wherein these two connecting electrodes are electrically insulated from the Hall effect material and form a respective capacitor together with the Hall effect material.

4. The gyrator according to claim 1, wherein in at least two spatial dimensions, the Hall effect material has an extension configured to contain, along each of these spatial dimensions, at least one million electrons that are mobile in both spatial directions.

5. The gyrator according to claim 1, wherein the Hall effect material has an extension of at least 100 nm in at least two spatial dimensions.

6. The gyrator according to claim 1, wherein means for applying an electric bias field to the insulating region between at least one connecting electrode and the Hall effect material are provided, the bias field changing the spatial distribution of the capacitance across the region of the connecting electrode.

7. The gyrator according to claim 6, wherein the capacitor includes a ferroelectric or a non-linear dielectric as insulation between the connecting electrode and the Hall effect material.

8. The gyrator according to claim 1, wherein the connecting electrodes are disposed along an outer circumference of the Hall effect material in relation o each other such that paths must be traveled, in opposite directions along this circumference from one connecting electrode to the neighboring connection electrode, that have lengths that differ by no more than 10%.

9. A gyrator for AC signals comprising:
a Hall effect material, means for permeating this Hall effect material with a magnetic field that is perpendicular to the plane or surface of the material, at least one input port for coupling an alternating current (I1:I2) into the Hall effect material, and at least one output port for outcoupling an output Voltage (U2;U1) which is a measure of the Hall voltage generated by the incoupled alternating current, wherein each port comprises at least two terminals that are connected to the outside, wherein at least one terminal of each port is connected to a connecting electrode, which is electrically insulated from the Hall effect material and forms a capacitor together with the Hall effect material, and wherein the Hall effect material has holes, the total surface area of which amounts up to nine times the surface area taken up by Hall effect material.

10. The gyrator according to claim 9, wherein the capacitances of capacitors formed by all connecting electrodes together with the respective Hail effect material differ from each other by no more than 10%.

11. The gyrator according to claim 9, wherein the Hall effect material is a quantum Hall effect material.

12. A gyrator for AC signals, comprising:
a Hall effect material, means for permeating this Hall effect material with a magnetic field that is perpendicular to the plane or surface of the material, at least one input port for coupling an alternating current (I1:I2) into the Hall effect material, and at least one output port for outcoupling an output voltage (U2:U1) which is a measure of the Hall voltage generated by the incoupled alternating current, wherein each port comprises at least two terminals that are connected to the outside, wherein at least one terminal of each port is connected to a connecting electrode, which is electrically insulated from the Hall effect material and forms a capacitor together with the Hall effect material, and wherein the outer circumference of the Hall effect material has a self-similar, in particular fractal, structure, at least in a sub-region in which one of the connecting electrodes forms a capacitor together with this sub-region.

13. The gyrator according to claim 12, wherein the Hall effect material forms the capacitor together with at least one connecting electrode along at least one outer circumference between 50% and 70% of the length of this outer circumference.

14. The gyrator according to claim 12, wherein each of the two terminals of the input port is connected to a connecting electrode, wherein these two connecting electrodes are electrically insulated from the Hall effect material and form a respective capacitor together with the Hall effect material.

15. The gyrator according to claim 12, wherein each of the two terminals of the output port is connected to a connecting electrode, wherein these two connecting electrodes are electrically insulated from the Hall effect material and form a respective capacitor together with the Hall effect material.

16. The gyrator according to claim 12, wherein in at least two spatial dimensions, the Hall effect material has an extension such as to contain, along each of these spatial dimensions, at least one million electrons that are mobile in both spatial directions.

17. The gyrator according to claim 12, wherein the Hall effect material has an extension of at least 100 nm in at least two spatial dimensions.

18. The gyrator according to claim 12, wherein the Hall effect material has an extension of at least 500 nm in at least two spatial dimensions.

19. The gyrator according to claim 12, wherein the Hall effect material has an extension of at least 1 μm in at least two spatial dimensions.

20. A gyrator for AC signals, comprising:
a Hall effect material,
means for permeating this Hall effect material with a magnetic field that is perpendicular to the plane or surface of the material,
at least one input port for coupling an alternating current (I1;I2) into the Hall effect material, and
at least one output port for outcoupling an output voltage (U2;U1) which is a measure of the Hall voltage generated by the incoupled alternating current,
wherein each port comprises at least two terminals that are connected to the outside,
wherein at least one terminal of each port is connected to a connecting electrode, which is electrically insulated from the Hall effect material and forms a capacitor together with the Hall effect material, and
wherein at least one connecting electrode forms a capacitor together with multiple layers of the Hall effect material that are electrically insulated from each other.

* * * * *